United States Patent [19]

Price et al.

[11] Patent Number: 4,737,474
[45] Date of Patent: Apr. 12, 1988

[54] SILICIDE TO SILICON BONDING PROCESS

[75] Inventors: J. B. Price, Scottsdale; Yu C. Chow; John Mendonca, both of Tempe; Schyi-Yi Wu, Mesa, all of Ariz.

[73] Assignee: Spectrum CVD, Inc., Phoenix, Ariz.

[21] Appl. No.: 931,479

[22] Filed: Nov. 17, 1986

[51] Int. Cl.$^4$ ............................................. H01L 21/28
[52] U.S. Cl. .................................... 437/200; 437/192; 437/193; 437/201; 437/188; 148/DIG. 1; 148/DIG. 147; 357/71
[58] Field of Search ...................... 357/67, 71; 29/590, 29/591; 427/89.85, 86; 148/DIG. 1, DIG. 147; 437/200, 192, 193, 201, 187, 188, 234

[56] References Cited

U.S. PATENT DOCUMENTS

| | | | |
|---|---|---|---|
| 4,322,453 | 3/1982 | Miller | 427/89 |
| 4,504,521 | 3/1985 | Widmer et al. | 427/85 |
| 4,581,627 | 4/1986 | Ueda et al. | 357/67 |

FOREIGN PATENT DOCUMENTS 0178642  9/1985  Japan ..................... 148/DIG. 147

OTHER PUBLICATIONS

*IBM Tech. Disc. Bull.*, vol. 28, No. 9, Feb. 1986, pp. 3968-3969.

Primary Examiner—Brian E. Hearn
Assistant Examiner—T. N. Quach
Attorney, Agent, or Firm—Paul F. Wille

[57] ABSTRACT

A process for forming a bonding layer comprising amorphous silicon, titanium, chromium, or tungsten, between the silicide and the N+ polysilicon layer is disclosed. The bonding layer is preferably less than 50 nm. thick. After the bonding layer is deposited, a silicide layer is deposited and the wafer is then sintered at 900°-1000° C. for ten minutes or less.

8 Claims, 1 Drawing Sheet

SILICIDE TO SILICON BONDING PROCESS

BACKGROUND OF THE INVENTION

This invention relates to the manufacture of semiconductor devices and, in particular, to semiconductor devices having a silicide/silicon bond.

As known in the art, refractory metal conductive layers are used instead of aluminum or gold in order to obtain a conductor which is more stable during subsequent high temperature process steps. In a particular application, as the gate metal in an MOS transistor, the silicide layer is deposited on a polycrystalline silicon layer and the combination sintered at approximately 900° C.

Because the layers are crystallographically different, and because of the sintering, the layers are under stress. The stress may exceed the adhesion strength of the silicide polycrystalline silicon interface, i.e. the silicide does not adhere well to the polycrystalline silicon. The adhesion problem is not simply one of mechanical stress. Part of the problem is believed to be the formation of what is known as native oxide on the polycrystalline silicon. This oxide is neither intended nor desired, but simply results from exposure of the wafer to an oxygen bearing ambient. The formation of the oxide occurs even at room temperature in air. It is often not thick enough to form a continuous layer.

Known attempts at improving adhesion include careful cleaning of the wafer, forming the silicide layer as soon as possible after forming the polycrystalline silicon layer, adjusting the silicon: metal ratio in the silicide, and reducing the doping level in the polycrystalline silicon, which is normally almost a saturated solid solution and using a silicide with maximum solubility of oxygen and thermodynamic driving force to reduce $SiO_2$. Even with these measures, adhesion remains a problem, reducing yield. The yield problem shows up as defective die found immediately after manufacture or as defective die found when the device is subjected to temperature cycles. The maximum allowable thickness of the silicide layer depends, although not exclusively, on the amount of stress. Thus, the maximum thickness of an adherent silicide layer becomes a figure of merit, with a thicker layer indicating a better bond or less stress, or both, than a thinner layer.

While improving yield, using any or all of the above techniques to improve adhesion compromises other process parameters. For example, increasing the ratio of silicon to metal improves adhesion but reduces the conductivity of the layer. Decreasing the doping of the polycrystalline silicon improves adhesion but increases electrical resistance of the polycrystalline silicon-silicide interconnects and also increases the contact resistance.

SUMMARY OF THE INVENTION

In view of the foregoing, it is therefore an object of the present invention to provide an improved bond between a polycrystalline silicon layer and a silicide layer.

Another object of the present invention is to enable one to obtain thicker silicide layers adherent to a polycrystalline silicon layer.

A further object of the present invention is to provide an improved gate metal system for MOS devices.

Another object of the present invention is to provide an improved method for forming adherent gate metal layers without further restricting other process parameters.

The foregoing objects are achieved in the present invention wherein an intermediate layer comprising amorphous silicon, titanium, or chrome is deposited on the polycrystalline silicon layer. A silicide layer, such as tungsten silicide, is deposited over the amorphous silicon, titanium, or chrome. The layers are then sintered at approximately 1000° C. for 3–10 minutes. A plasma is used to enhance the initial deposition of the tungsten silicide. Silicides of tantalum, titanium, molybdenum, or tungsten can be used.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
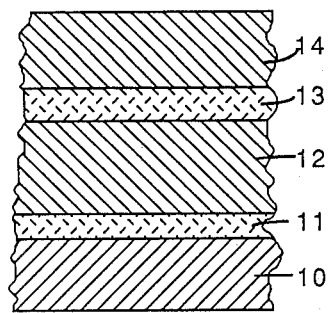
FIG. 1 illustrates a cross-section of a portion of a wafer processed in accordance with the prior art.

FIG. 1 illustrates a wafer processed in accordance with the prior art. Specifically, substrate 10 has gate oxide layer 11 grown thereon. Gate oxide layer 11 is typically 10 to 100 nm. thick. Overlying gate oxide layer 11 is n+ polycrytalline silicon layer 12, which typically has a thickness of about 200 to 400 nm. Overlying the polycrystalline silicon layer (hereinafter referred to simply as "poly") is layer 13 of what is known as native oxide, i.e. an oxide layer formed inevitably as the result of leaving the upper surface of poly layer 12 exposed to air. Native oxide layer 13 is typically 1.5 to 5.0 nm. thick, i.e. it may not be sufficiently thick to form a continuous layer. It is shown as a layer in the figures only for convenience. Layer 14 of tungsten silicide is then deposited over what is believed to be the poly layer but which in fact comprises poly layer 12 and native oxide 13. The presence of native oxide layer 13 interferes with the adhesion of the tungsten silicide layer. In addition, the tungsten silicide layer is highly stressed, even after annealing. As a result of this stress, there may be a limit to the possible thickness of the tungsten silicide layer, e.g. 60 nm. or less.

Figure 2:
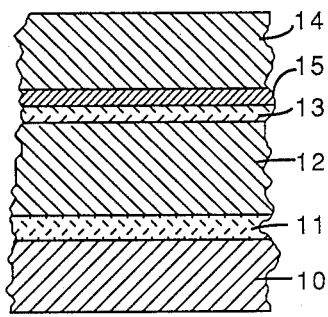
FIG. 2 illustrates a cross-section of a portion of a wafer processed in accordance with the present invention.

As illustrated in FIG. 2, substrate 10 also has a gate oxide layer 11 formed thereon and poly layer 12 deposited upon gate oxide layer 11. As previously indicated, the formation of native oxide layer 13 is extremely difficult to avoid and occurs even in the present invention. However the effects of native oxide layer 13 are substantially reduced by the deposition of amorphous silicon layer 15 between tungsten silicide layer 14 and poly layer 12. Amorphous silicon layer 15 acts as a bonding layer between poly layer 12 and subsequently deposited silicide layer 14.

Typical values for the various components are as follows. Wafer or substrate 10 is typically approximately 20 mils (0.5 mm) thick while gate oxide layer 11 is typically 20 nm. thick and n+ poly layer 12 is typically 250–500 nm. thick. Bonding layer 15 is typically 20 nm. thick and should be less than about 60 nm. thick. Silicide layer 14, which preferably comprises tungsten silicide, is typically 200 nm. thick, although adherent silicide layers of 500 nm. have been deposited.

Wafer 10 is then sintered at a temperature greater than 800° C. for less than about ten minutes. In a preferred embodiment of the present invention, wafer 10 is sintered at a temperature of 1000° C. for approximately three minutes.

Figure 3:
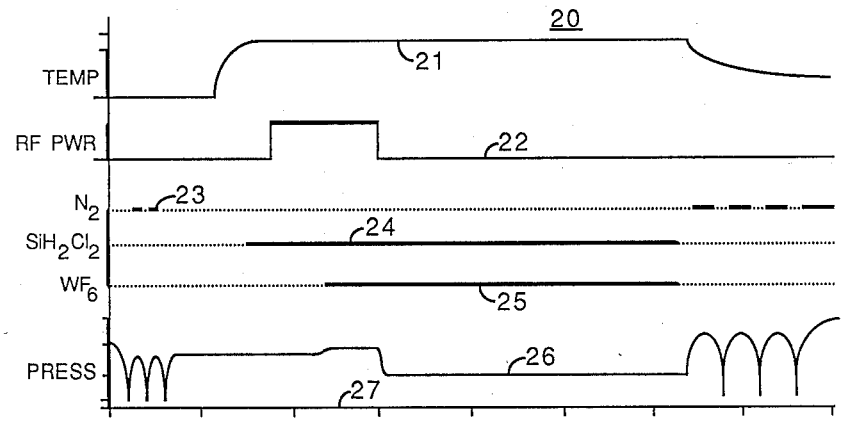
FIG. 3 illustrates a process flow in accordance with the present invention.

A more complete understanding of the process in accordance with the present invention can be obtained by considering the process sequence illustrated in FIG. 3. FIG. 3 comprises chart 20 illustrating the conditions within a plasma reactor chamber for depositing a tungsten silicide layer on amorphous silicon layer 15. The reactor is preferably a single wafer, parallel plate reactor. Specifically, curve 21 illustrates the variation in temperature of the wafer as it is heated and permitted to cool within the plasma reactor chamber. Curve 22 illustrates the variation in applied power for causing the generation of a plasma. Curve 23 illustrates the application of nitrogen gas to the reactor chamber. Similarly, curves 24 and 25 illustrate the application of dichlorosilane and tungsten hexafluoride, respectively. Curve 26 illustrates the variation of pressure with time within the plasma reactor. Curve 27 is the abscissa designating time in seconds.

Chart 20 is representative of the conditions within a single wafer plasma reactor chamber. After a wafer is placed within the chamber and the chamber is sealed, the chamber must be purged of ambient gases. This is illustrated by curve 26 and curve 23. The chamber is permitted to stabilize for about twenty seconds, at which point the wafer is heated to a temperature between 400° and 600° C., as illustrated by curve 21. Prior to the temperature of the wafer being raised, there is essentially no deposition of silicon on the wafer. At this point the plasma is ignited, the dichlorosilane dissociates to form amorphous silicon on layer 13 on poly layer 12.

At approximately thirty seconds into the run, tungsten hexafluoride is supplied to the reactor chamber as illustrated by curve 25. Dichlorosilane continues to be supplied to the chamber, power continues to be applied to the electrodes of the reactor, and the wafer is maintained at a temperature between 400° and 600° C. With the application of tungsten hexafluoride gas, deposition of amorphous silicon ceases and deposition of tungsten silicide is initiated. After approximately forty-five seconds, or more specifically, approximately fifteen seconds after the tungsten hexafluoride was initially supplied to the reactor, the power applied to the electrodes is terminated as illustrated by curve 22. The wafer is maintained at a temperature between 400° and 600° C. as illustrated by curve 21. It has been found that this process produces a better quality and thicker silicide layer than would be obtained if the plasma were to be continued. That is, the deposition continues due to the elevated temperature of the wafer and despite the absence of a plasma.

After approximately one hundred sixty seconds, the process is terminated by shutting off the supplies of dichlorosilane and tungsten hexafluoride. As illustrated by curve 21, at this point the wafer temperature is no longer maintained and the wafer is permitted to cool.

As illustrated by curve 23, nitrogen gas is supplied intermittently to the reactor to purge the reactor of the dichlorosilane and tungsten hexafluoride gases as well as various byproducts thereof. After a few cycles, i.e. at approximately two hundred seconds after the start of the process run, the chamber is restored to 760 mm of $N_2$ and the wafer can be removed for the sintering operation or heated in situ to approximately 1000° C. in a controlled atmosphere.

Figure 4:
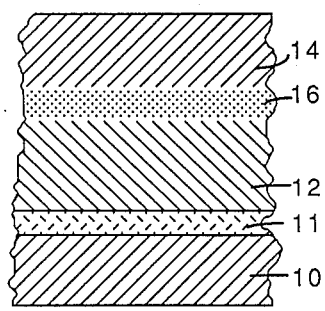
FIG. 4 illustrates a portion of a wafer after annealing in accordance with the present invention.

FIG. 4 illustrates a structure in accordance with the present invention after the sintering step. Wafer 10 and gate oxide layer 11 are essentially as before. Subsequent to the sintering, bonding layer 15 in effect disappears from between poly layer 12 and silicide layer 14. In its place is interstitial zone 16 which comprises elements from layers 12, 13, 14 and 15 in an interdiffused alloy system. That is, some of the phosphorus doping from n+ layer 12 diffuses through amorphous silicon layer 13 while some of the tungsten from tungsten silicide layer 14 diffuses downwardly into the amorphous silicon layer. The amorphous silicon layer is glassy and quite reactive and is believed to dissolve native oxide which may have formed on polycrystalline layer 12. Interstitial zone 16 is no longer glassy but comprises poly intimately bonded to tungsten silicide layer 14. As a result of the sintering, amorphous silicon layer 15 loses its glassy, highly insulating nature and becomes conductive. The result is a gate metal composite typically having a resistivity of 30 to 40 micro-ohm centimeters.

There is thus provided by the present invention a simple yet not unsophisticated process by which two layers are formed and in which, more particularly, a silicide layer is formed on a polycrystalline silicon layer with greater bonding strength than has been obtainable in the prior art. As previously noted, the thickness of an adherent silicide layer is indicative of the quality or strength of the bond. In a process as described above, adherent silicide layers of 500 nm. in thickness were deposited. Moreover, these layers are characterized by a low resistivity after the sintering step. Further, the process in accordance with the present invention does not require compromise of other process parameters.

Figure 5:
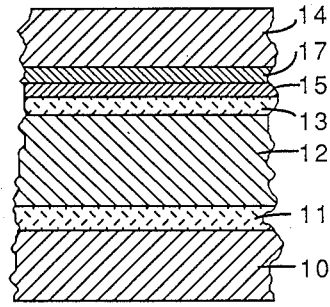
FIG. 5 illustrates an alternative embodiment of the present invention.

FIG. 5 illustrates an alternative embodiment of the present invention wherein a second bonding layer is used to control the relative proportions of the elements in interstitial layer 16. In so doing, adhesion is further enhanced.

Specifically, amorphous silicon layer is deposited as before, e.g. to a thickness of 20 nm. The next layer is nominally tungsten disilicide, as is layer 14. However, the proportion of gases is controlled so that an exact 1:2 ratio of tungsten to silicon is not obtained. Specifically, silicide layer 17 is silicon poor while silicide layer 14 is silicon rich. "Poor" and "rich" are understood relative to the stoichiometric ratio, 1:2 in the case of tungsten disilicide, and depend in part on one's ability to control the proportion of the gases.

Despite the thinness of silicide layer 17, approximately 20 nm., the strength of the bond is improved. During annealing, the layers interdiffuse as before, absorbing the native oxide layer. The resulting structure is essentially as shown in FIG. 4, although Auger analysis reveals the silicon poor region in layer 16.

Having thus described the invention it will be apparent to those of skill in the art that various modifications can be made within the spirit and scope of the present invention. For example, the bonding layer may comprise titanium, chromium, molybdenum, or tungsten instead of amorphous silicon. While one need not terminate the plasma as described above, it has been found that superior layers are formed if the plasma is terminated after a sufficient time for nucleation of the metal in the silicide compound. While the adhesion promoting techniques of the prior art are not necessary in the present invention, they may be used in addition to the present invention. That is, the present invention is compatible with these techniques, such as adjusting the silicon to metal ratio in the silicide.

We claim:

1. A process for forming an adherent layer of silicide on a polycrystalline silicon layer comprising the steps of:

depositing an amorphous silicon layer on native oxide on said polycrystalline silicon layer; and then depositing said silicide layer on said amorphous silicon layer; and sintering said three layers to bond said silicide layer to said polycrystalline silicon layer.

2. The process as set forth in claim 1 wherein said sintering step comprises:

heating said layers to a temperature above 800° C. for less than approximately ten minutes.

3. The process as set forth in claim 2 wherein said amorphous silicon layer is deposited to a thickness of from 25 to 50 nm.

4. The process as set forth in claim 3 wherein said silicide layer is deposited to a thickness of from 200 to 300 nm.

5. The process as set forth in claim 4 wherein said amorphous silicon layer is undoped.

6. The process as set forth in claim 4 wherein said silicide is selected from the group consisting essentially of the silicides of tungsten, tantalum, titanium, and molybdenum.

7. The process as set forth in claim 1 wherein said amorphous silicon layer is deposited from dichlorosilane.

8. The process as set forth in claim 7 wherein said silicide layer is deposited from a mixture of tungsten hexafluoride and said dichlorosilane.

* * * * *